US010504996B2

(12) United States Patent
Uchida et al.

(10) Patent No.: US 10,504,996 B2
(45) Date of Patent: Dec. 10, 2019

(54) SILICON CARBIDE SEMICONDUCTOR DEVICE

(71) Applicant: Sumitomo Electric Industries, Ltd., Osaka-shi (JP)

(72) Inventors: Kosuke Uchida, Osaka (JP); Toru Hiyoshi, Osaka (JP); Keiji Wada, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 16/220,501

(22) Filed: Dec. 14, 2018

(65) Prior Publication Data

US 2019/0123146 A1     Apr. 25, 2019

Related U.S. Application Data

(62) Division of application No. 15/552,170, filed as application No. PCT/JP2016/053946 on Feb. 10, 2016, now Pat. No. 10,192,961.

(30) Foreign Application Priority Data

Feb. 20, 2015   (JP) ................................. 2015-031789

(51) Int. Cl.
*H01L 29/161*     (2006.01)
*H01L 29/16*      (2006.01)
(Continued)

(52) U.S. Cl.
CPC ...... *H01L 29/1608* (2013.01); *H01L 29/0696* (2013.01); *H01L 29/086* (2013.01);
(Continued)

(58) Field of Classification Search
CPC .......................... H01L 29/1608; H01L 29/739
See application file for complete search history.

(56) References Cited

U.S. PATENT DOCUMENTS 8,436,367 B1 *  5/2013  Sdrulla ............. H01L 29/42368
                                                    257/77
2006/0057796 A1   3/2006  Harada et al.
(Continued)

FOREIGN PATENT DOCUMENTS

JP      2006-156687 A     6/2006
JP      2009-182271 A     8/2009
(Continued)

OTHER PUBLICATIONS

Kitabatake et al., "Electrical Characteristics/Reliability Affected by Defects Analyzed by the Integrated Evaluation Platform for SiC epitaxial films," Materials Science Forum, 2014, vol. 778-780, pp. 979-984.

*Primary Examiner* — George R Fourson, III
(74) *Attorney, Agent, or Firm* — Baker Botts L.L.P.; Michael A. Sartori

(57) ABSTRACT

A silicon carbide semiconductor device includes a silicon carbide substrate and a gate insulating film. The silicon carbide substrate has a first main surface and a second main surface opposite to the first main surface. The gate insulating film is provided on the first main surface. The silicon carbide substrate includes a first body region having p type, a second body region having p type, and a JFET region provided between the first body region and the second body region and having n type. The JFET region has both a first impurity capable of providing the p type and a second impurity capable of providing the n type. A concentration of the second impurity is higher than a concentration of the first impurity. The silicon carbide semiconductor device capable of suppressing dielectric breakdown of the gate insulating film is provided.

4 Claims, 9 Drawing Sheets

(51) Int. Cl.
*H01L 29/739* (2006.01)
*H01L 29/12* (2006.01)
*H01L 29/06* (2006.01)
*H01L 29/08* (2006.01)
*H01L 29/167* (2006.01)
*H01L 29/78* (2006.01)
*H01L 29/66* (2006.01)
*H01L 29/34* (2006.01)

(52) U.S. Cl.
CPC .......... *H01L 29/0878* (2013.01); *H01L 29/12* (2013.01); *H01L 29/167* (2013.01); *H01L 29/34* (2013.01); *H01L 29/66068* (2013.01); *H01L 29/739* (2013.01); *H01L 29/7802* (2013.01); *H01L 29/7395* (2013.01)

(56) References Cited

U.S. PATENT DOCUMENTS

| | | | | |
|---|---|---|---|---|
| 2007/0278571 A1* | 12/2007 | Bhalla | ................ | H01L 29/0847 257/341 |
| 2008/0206941 A1* | 8/2008 | Okuno | ................ | H01L 29/0615 438/198 |
| 2012/0153303 A1* | 6/2012 | Uchida | ............. | H01L 29/41766 257/77 |
| 2012/0286290 A1* | 11/2012 | Uchida | ................ | H01L 29/7828 257/77 |
| 2012/0305943 A1* | 12/2012 | Honaga | ............... | H01L 29/0878 257/77 |
| 2013/0034941 A1* | 2/2013 | Dhar | .................. | H01L 21/3115 438/285 |
| 2014/0183552 A1* | 7/2014 | Zhang | ................ | H01L 29/7802 257/77 |
| 2014/0210008 A1* | 7/2014 | Oritsuki | ............ | H01L 21/26513 257/362 |
| 2014/0246682 A1* | 9/2014 | Uchida | ............... | H01L 27/0629 257/77 |
| 2014/0284621 A1 | 9/2014 | Shimizu et al. | | |
| 2015/0028350 A1* | 1/2015 | Suvorov | ............. | H01L 29/1608 257/77 |
| 2015/0034974 A1 | 2/2015 | Nishio et al. | | |
| 2015/0087125 A1 | 3/2015 | Nishio et al. | | |
| 2015/0097226 A1* | 4/2015 | Lichtenwalner | .... | H01L 29/4925 257/329 |
| 2015/0162432 A1* | 6/2015 | Kumagai | ........... | H01L 29/0684 257/77 |
| 2015/0263145 A1* | 9/2015 | Pala | .................... | H01L 29/7395 257/77 |
| 2015/0311076 A1* | 10/2015 | Hiyoshi | ........... | H01L 29/66068 257/77 |
| 2016/0163817 A1* | 6/2016 | Horii | ................. | H01L 29/66068 438/268 |
| 2016/0181373 A1* | 6/2016 | Masuda | ........... | H01L 29/66068 257/77 |
| 2016/0190300 A1* | 6/2016 | Domeij | ............... | H01L 29/7802 257/77 |
| 2016/0351667 A1* | 12/2016 | Wada | .................. | H01L 21/0475 |
| 2017/0125575 A1* | 5/2017 | Ohoka | ................. | H01L 29/0878 |
| 2017/0263745 A1* | 9/2017 | Kinoshita | ........... | H01L 29/0878 |
| 2017/0345891 A1* | 11/2017 | Van Brunt | .......... | H01L 29/0634 |
| 2018/0096854 A1* | 4/2018 | Wada | ...................... | C30B 29/36 |
| 2018/0254339 A1* | 9/2018 | Kiyosawa | ......... | H01L 29/41766 |
| 2018/0308937 A1* | 10/2018 | Hirose | .................. | H01L 21/049 |
| 2018/0323299 A1* | 11/2018 | Tominaga | ............ | H01L 29/06 |
| 2019/0006471 A1* | 1/2019 | Watanabe | .......... | H01L 29/7393 |
| 2019/0131388 A1* | 5/2019 | Watanabe | ............ | H01L 21/20 |

FOREIGN PATENT DOCUMENTS

| | | |
|---|---|---|
| JP | 2013-034007 A | 2/2013 |
| JP | 2014-183274 A | 9/2014 |
| JP | 2014-187112 A | 10/2014 |
| WO | 2004/036655 A1 | 4/2004 |

* cited by examiner

SILICON CARBIDE SEMICONDUCTOR DEVICE

CROSS REFERENCE TO RELATED APPLICATIONS

This application is a Divisional of U.S. patent application Ser. No. 15/552,170, filed Aug. 18, 2017, which is a 371 application of International Application No. PCT/JP2016/053946, filed Feb. 10, 2016, which claims the benefit of Japanese Patent Application No. 2015-031789, filed Feb. 20, 2015.

TECHNICAL FIELD

The present disclosure relates to silicon carbide semiconductor devices.

BACKGROUND ART

In recent years, silicon carbide has been increasingly employed as a material forming a semiconductor device in order to allow for a higher breakdown voltage, lower loss, the use in a high-temperature environment and the like of the semiconductor device.

A silicon carbide substrate is manufactured with a sublimation-recrystallization method, for example. However, a silicon carbide substrate usually includes dislocations. It is extremely difficult at the present time to manufacture a silicon carbide substrate completely free of dislocations. Japanese Patent Laying-Open No. 2013-34007 (PTD 1) discloses a silicon carbide epitaxial wafer in which step bunching coupled to shallow pits resulting from screw dislocations in a silicon carbide epitaxial layer has a linear density of 5 mm$^{-1}$.

Makoto Kitabatake and eight others, "Electrical Characteristics Reliability Affected by Defects Analyzed by the Integrated Evaluation Platform for SiC epitaxial films," Materials Science Forum, 2014, Vols. 778-780, p. 979-984 (NPD 1) discloses a method of evaluating electrical characteristics and reliability affected by defects preset in a silicon carbide epitaxial film.

CITATION LIST

Patent Document

PTD 1: Japanese Patent Laying-Open No. 2013-34007

Non Patent Document

NPD 1: Makoto Kitabatake and eight others, "Electrical Characteristics Reliability Affected by Defects Analyzed by the Integrated Evaluation Platform for SiC epitaxial films," Materials Science Forum, 2014, Vols. 778-780, p. 979-984

SUMMARY OF INVENTION

Technical Problem

An object of one embodiment of the present disclosure is to provide a silicon carbide semiconductor device capable of suppressing dielectric breakdown of a gate insulating film.

Solution to Problem

A silicon carbide semiconductor device according to one embodiment of the present disclosure includes a silicon carbide substrate and a gate insulating film. The silicon carbide substrate has a first main surface and a second main surface opposite to the first main surface. The gate insulating film is provided on the first main surface. The silicon carbide substrate includes a first body region being in contact with the gate insulating film at the first main surface and having a first conductivity type, a second body region being in contact with the gate insulating film at the first main surface and having the first conductivity type, and a JFET region provided between the first body region and the second body region and having a second conductivity type different from the first conductivity type. The JFET region has both a first impurity capable of providing the first conductivity type and a second impurity capable of providing the second conductivity type. A concentration of the second impurity is higher than a concentration of the first impurity. The first conductivity type is p type. The second conductivity type is n type.

A silicon carbide semiconductor device according to one embodiment of the present disclosure includes a silicon carbide substrate and a gate insulating film. The silicon carbide substrate has a first main surface and a second main surface opposite to the first main surface. The gate insulating film is provided on the first main surface. The silicon carbide substrate includes a first body region being in contact with the gate insulating film at the first main surface and having a first conductivity type, a second body region being in contact with the gate insulating film at the first main surface and having the first conductivity type, a drift region having a second conductivity type different from the first conductivity type, and a JFET region provided between the first body region and the second body region in a direction parallel to the first main surface, provided between the gate insulating film and the drift region in a direction perpendicular to the first main surface, and having the second conductivity type. The JFET region and the drift region each have an impurity capable of providing the second conductivity type. A density of threading dislocations in the first main surface is not less than 100 cm$^{-2}$ and not more than 10000 cm$^{-2}$. A concentration of the impurity included in the JFET region is lower than a concentration of the impurity included in the drift region. The first conductivity type is p type. The second conductivity type is n type.

Advantageous Effects of Invention

According to the above, a silicon carbide semiconductor device capable of suppressing dielectric breakdown of a gate insulating film can be provided.

DESCRIPTION OF EMBODIMENTS

Figure 1:
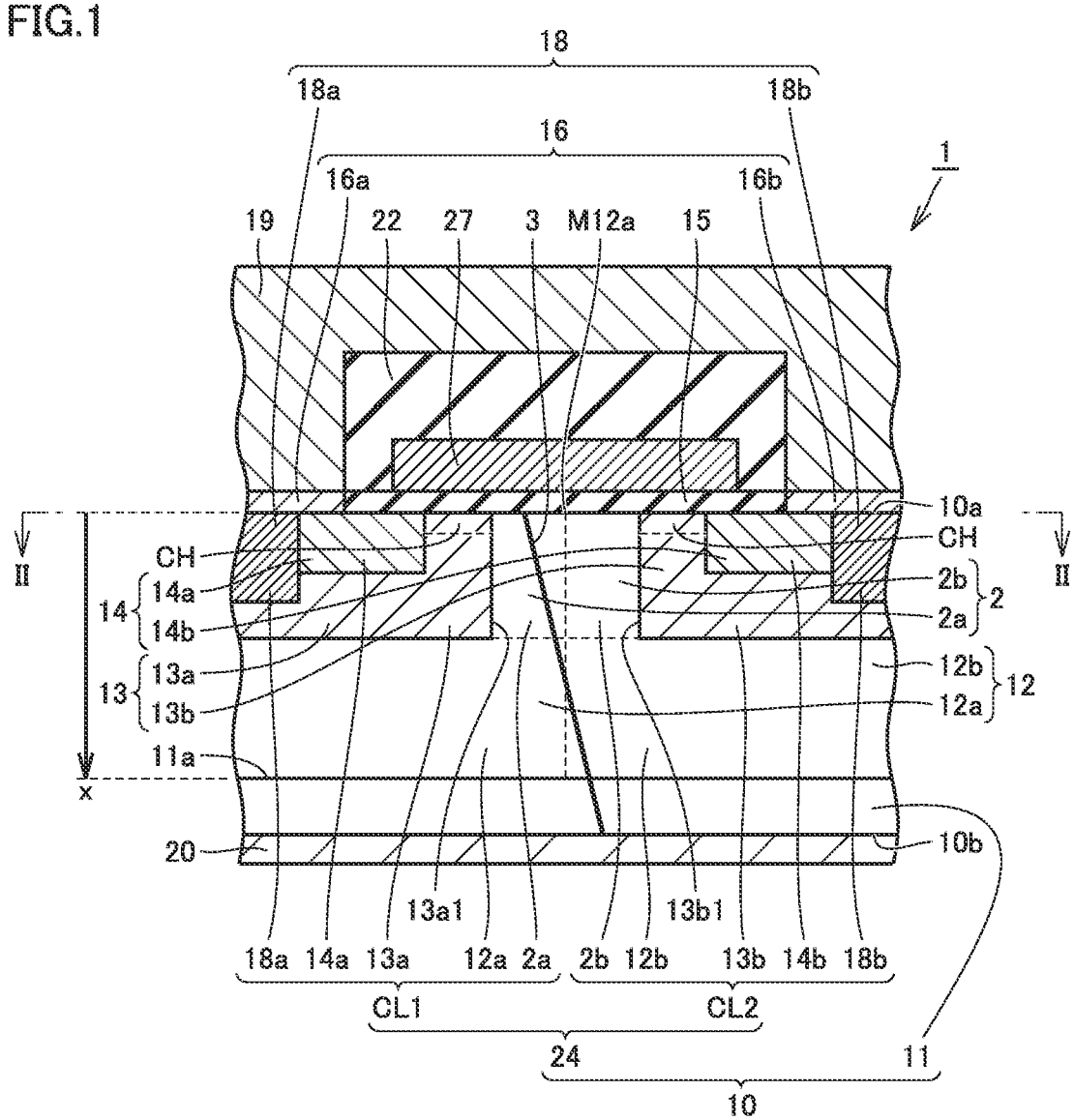
FIG. 1 is a schematic vertical sectional view of a silicon carbide semiconductor device according to first and second embodiments, and corresponds to a view taken along the line I-I in a direction of arrows in FIG. 2.

A gate insulating film of a planar MOSFET (Metal Oxide Semiconductor Field Effect Transistor), for example, is provided between a gate electrode and a JFET (Junction Field Effect Transistor) region. Thus, when a voltage is applied between a drain electrode and a source electrode, an electric field is concentrated in a portion of the gate insulating film on the JFET region. When the transistor is in an off state, the source electrode has a ground potential (0V), the drain electrode has 1700V applied thereto, for example, and the gate electrode has a ground potential (0V). There is thus a potential difference of about 1700V between the gate electrode and the source electrode. In other words, when the transistor is in an off state, the electric field is concentrated in the gate insulating film. As a result, dielectric breakdown tends to occur in a portion of the gate insulating film on the JFET region.

Accordingly, the present inventors conceived of reducing the intensity of the electric field applied to the gate insulating film provided on the JFET region, by reducing an effective carrier concentration in the JFET region.

Description of Embodiments of the Present Disclosure

Next, embodiments of the present disclosure will be listed and described.

(1) A silicon carbide semiconductor device 1 according one embodiment of the present disclosure includes a silicon carbide substrate 10 and a gate insulating film 15. Silicon carbide substrate 10 has a first main surface 10a and a second main surface 10b opposite to first main surface 10a. Gate insulating film 15 is provided on first main surface 10a. Silicon carbide substrate 10 includes a first body region 13a being in contact with gate insulating film 15 at first main surface 10a and having a first conductivity type, a second body region 13b being in contact with gate insulating film 15 at first main surface 10a and having the first conductivity type, and a JFET region 2 provided between first body region 13a and second body region 13b and having a second conductivity type different from the first conductivity type. JFET region 2 has both a first impurity capable of providing the first conductivity type and a second impurity capable of providing the second conductivity type. A concentration of the second impurity is higher than a concentration of the first impurity. The first conductivity type is p type. The second conductivity type is n type.

In accordance with silicon carbide semiconductor device 1 according to (1) above, JFET region 2 has both the first impurity capable of providing the first conductivity type and the second impurity capable of providing the second conductivity type. Accordingly, carriers of different conductivity types are offset from one another, which can lead to a reduction in effective carrier concentration in the JFET region. Thus, the dielectric breakdown of gate insulating film 15 on JFET region 2 can be suppressed.

(2) In silicon carbide semiconductor device 1 according to (1) above, a density of threading dislocations 3 in first main surface 10a may be not less than 100 $cm^{-2}$ and not more than 10000 $cm^{-2}$.

If there are threading dislocations 3 in first main surface 10a, an electric field tends to be concentrated particularly in portions of gate insulating film 15 formed in the vicinity of threading dislocations 3. One possible cause for the electric field concentration is that, during thermal oxidation of main surface 10a in the step of forming gate insulating film 15, pits resulting from threading dislocations 3 increase, causing the electric field to be concentrated in the vicinity of the pits. Another possible cause for the electric field concentration is that the thickness of gate insulating film 15 becomes non-uniform in the vicinity of the pits, which may have caused dielectric breakdown at the thinned portions of gate insulating film 15. By providing gate insulating film 15 on first main surface 10a in which the density of threading dislocations 3 is not less than 100 $cm^{-2}$ and not more than 10000 $cm^{-2}$, the dielectric breakdown of gate insulating film 15 formed on threading dislocations 3 can be suppressed.

(3) In silicon carbide semiconductor device 1 according to (1) or (2) above, the concentration of the first impurity may increase from second main surface 10b toward first main surface 10a. Accordingly, the carrier concentration on the second main surface 10b side can be kept at high level while the carrier concentration on the first main surface 10a side is reduced, thereby allowing the on-resistance to be kept at low level.

(4) In silicon carbide semiconductor device 1 according to any one of (1) to (3) above, the first impurity may be aluminum. Since aluminum is less likely to be diffused than the other types of the first impurity, the carrier concentration in the vicinity of first main surface 10a can be accurately reduced.

(5) In silicon carbide semiconductor device 1 according to any one of (1) to (4) above, the concentration of the second impurity may be not less than $1 \times 10^{14}$ cm$^{-3}$ and not more than $1 \times 10^{16}$ cm$^{-3}$.

(6) In silicon carbide semiconductor device 1 according to any one of (1) to (5) above, silicon carbide substrate 10 includes a first cell region CL1 having an outer shape of a polygon as seen along a direction perpendicular to first main surface 10a, and a second cell region CL2 sharing one side M12a of the polygon with first cell region CL1 and having an outer shape of the polygon as seen along the direction perpendicular to first main surface 10a. JFET region 2 may include an end C0 of one side M12a. The dielectric breakdown of a portion of gate insulating film 15 on end C0, where the electric field tends to be concentrated, can thereby be suppressed.

(7) A silicon carbide semiconductor device 1 according one embodiment of the present disclosure includes a silicon carbide substrate 10 and a gate insulating film 15. Silicon carbide substrate 10 has a first main surface 10a and a second main surface 10b opposite to first main surface 10a. Gate insulating film 15 is provided on first main surface 10a. Silicon carbide substrate 10 includes a first body region 13a being in contact with gate insulating film 15 at first main surface 10a and having a first conductivity type, a second body region 13b being in contact with gate insulating film 15 at first main surface 10a and having the first conductivity type, a drift region 12 having a second conductivity type different from the first conductivity type, and a JFET region 2 provided between first body region 13a and second body region 13b in a direction parallel to first main surface 10a, provided between gate insulating film 15 and drift region 12 in a direction perpendicular to first main surface 10a, and having the second conductivity type. JFET region 2 and drift region 12 each have an impurity capable of providing the second conductivity type. A density of threading dislocations 3 in first main surface 10a is not less than 100 cm$^{-2}$ and not more than 10000 cm$^{-2}$. A concentration of the impurity included in JFET region 2 is lower than a concentration of the impurity included in drift region 12. The first conductivity type is p type. The second conductivity type is n type.

In accordance with silicon carbide semiconductor device 1 according to (7) above, the concentration of the impurity included in JFET region 2 is lower than the concentration of the impurity included in drift region 12. The on-resistance can thereby be reduced while the dielectric breakdown of gate insulating film 15 on JFET region 2 is suppressed. In addition, by providing gate insulating film 15 on first main surface 10a in which the density of threading dislocations 3 is not less than 100 cm$^{-2}$ and not more than 10000 cm$^{-2}$, the dielectric breakdown of gate insulating film 15 formed on threading dislocations 3 can be suppressed.

(8) In silicon carbide semiconductor device 1 according to (7) above, the concentration of the impurity included in JFET region 2 may be not less than $1 \times 10^{14}$ cm$^{-3}$ and not more than $1 \times 10^{16}$ cm$^{-3}$.

(9) In silicon carbide semiconductor device 1 according to (7) or (8) above, in JFET region 2, the concentration of the impurity may decrease from second main surface 10b toward first main surface 10a. The on-resistance can thereby be reduced while the dielectric breakdown of gate insulating film 15 on JFET region 2 is suppressed.

(10) In silicon carbide semiconductor device 1 according to any one of (7) to (9) above, in drift region 12, the concentration of the impurity may decrease from second main surface 10b toward first main surface 10a. The on-resistance can thereby be reduced while the dielectric breakdown of gate insulating film 15 on JFET region 2 is suppressed.

Details of Embodiments of the Present Disclosure

The embodiments of the present disclosure will be described below based on the drawings. It is noted that the same or corresponding parts are designated by the same reference numbers in the following drawings, and description thereof will not be repeated. Regarding crystallographic indications in the present specification, an individual orientation is represented by [ ], a group orientation is represented by < >, an individual plane is represented by ( ), and a group plane is represented by { }. In addition, a negative crystallographic index is normally expressed by putting "-" (bar) above a numeral, but is expressed by putting a negative sign before the numeral in the present specification.

First Embodiment

First, the configuration of a MOSFET 1 as a silicon carbide semiconductor device 1 according to a first embodiment of the present disclosure will be described.

As shown in FIG. 1, MOSFET 1 according to the present embodiment mainly has a silicon carbide substrate 10, a gate insulating film 15, a gate electrode 27, a source electrode 16, a drain electrode 20, an interlayer insulating film 22, and a source line 19.

Silicon carbide substrate 10 mainly has a silicon carbide single-crystal substrate 11, and a silicon carbide epitaxial layer 24 arranged on silicon carbide single-crystal substrate 11. Silicon carbide single-crystal substrate 11 is made of hexagonal silicon carbide having a polytype of 4H, for example. Silicon carbide single-crystal substrate 11 includes an n type impurity such as nitrogen and has n type conductivity (second conductivity type). Silicon carbide substrate 10 has a first main surface 10a constituted by silicon carbide epitaxial layer 24, and a second main surface 10b located opposite to first main surface 10a and constituted by silicon carbide single-crystal substrate 11. First main surface 10a of silicon carbide substrate 10 is a plane angled off by not more than about 8° relative to a {0001} plane, for example, and preferably a plane angled off by not more than about 8° relative to a (0001) plane. Silicon carbide epitaxial layer 24 mainly has a body region 13, a JFET region 2, a drift region 12, a source region 14, and a contact region 18.

Figure 2:
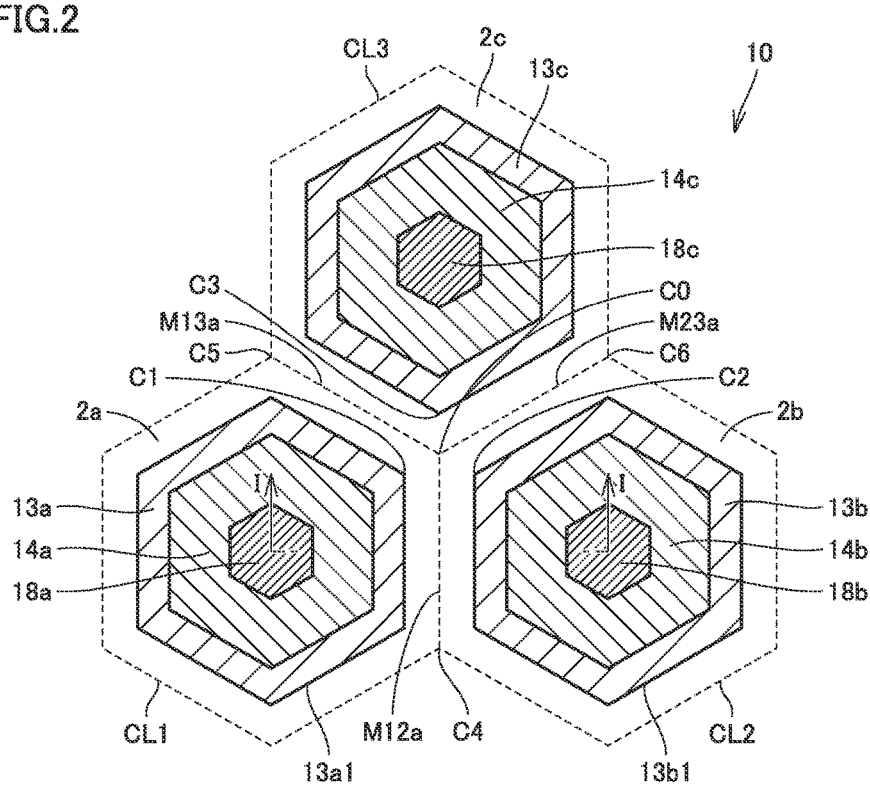
FIG. 2 is a schematic transverse sectional view showing the silicon carbide semiconductor device according to the first and second embodiments, and corresponds to a view taken along the line II-II in a direction of arrows in FIG. 1.

Body region 13 includes a p type impurity such as aluminum or boron and has p type conductivity (first conductivity type). The concentration of the p type impurity included in body region 13 is, for example, not less than $1 \times 10^{16}$ cm$^{-3}$ and not more than $1 \times 10^{18}$ cm$^{-3}$. As shown in FIGS. 1 and 2, body region 13 has a first body region 13a, a second body region 13b and a third body region 13c. First body region 13a, second body region 13b and third body region 13c are in contact with gate insulating film 15 at first main surface 10a.

JFET region 2 has both a first impurity capable of providing p type (first conductivity type) and a second impurity capable of providing n type (second conductivity type). The first impurity is a p type impurity such as aluminum or boron. The second impurity is an n type impurity such as nitrogen or phosphorus. In JFET region 2, the concentration of the second impurity is higher than the concentration of the first impurity. Thus, JFET region 2 has n type conductivity different from the p type conductivity.

As shown in FIGS. 1 and 2, JFET region 2 has a first JFET region 2a, a second JFET region 2b and a third JFET region 2c. As shown in FIG. 1, JFET region 2 is provided between first body region 13a and second body region 13b. As shown in FIG. 2, JFET region 2 is provided between third body region 13c and second body region 13b.

Drift region 12 has an n type impurity (second impurity) such as nitrogen and has n type conductivity. Drift region 12 is formed continuously with JFET region 2. The concentration of the n type impurity included in drift region 12 is substantially equal to the concentration of the n type impurity included in JFET region 2. Drift region 12 is provided between JFET region 2 and silicon carbide single-crystal substrate 11, and is provided between body region 13 and silicon carbide single-crystal substrate 11. Drift region 12 has a first drift region 12a, a second drift region 12b and a third drift region 12c.

Figure 3:
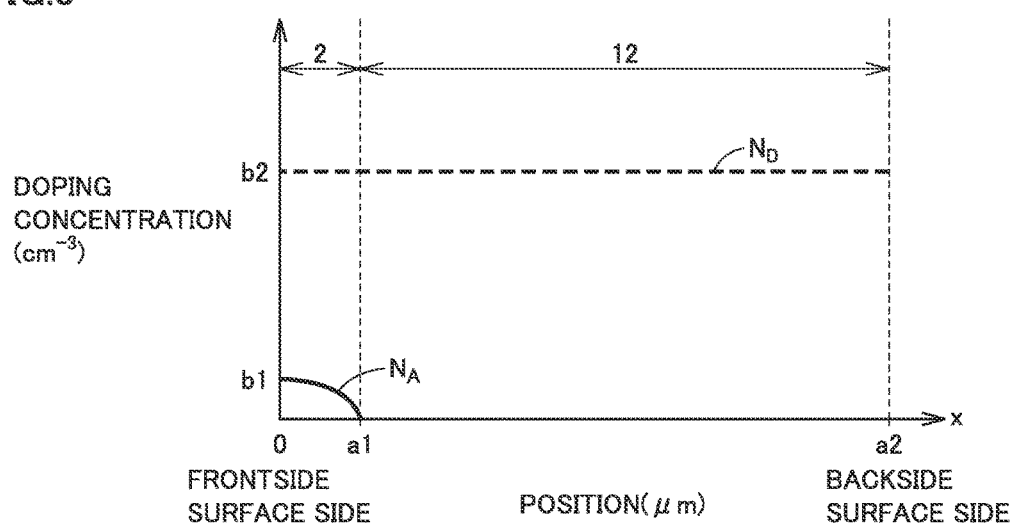
FIG. 3 is a diagram showing a relationship between doping concentration in a JFET region and a drift region according to the first embodiment and the position along a direction perpendicular to a first main surface.

In FIG. 3, the vertical axis represents doping concentration of the first impurity or the second impurity in JFET region 2 and drift region 12, and the horizontal axis represents the position along a direction parallel to the arrows in FIG. 1. In the horizontal axis, a position 0 corresponds to a side M12a on first main surface 10a, and a position a2 corresponds to a surface 11a of silicon carbide single-crystal substrate 11. In other words, position 0 is the front surface side of silicon carbide epitaxial layer 24, and position a2 is the back surface side of silicon carbide epitaxial layer 24. In FIG. 3, $N_D$ represents donor concentration (that is, the concentration of the second impurity), and $N_A$ represents acceptor concentration (that is, the concentration of the first impurity). As shown in FIG. 3, in JFET region 2 and drift region 12, the concentration of the second impurity is substantially constant. A concentration b2 of the second impurity in JFET region 2 and drift region 12 is $6\times10^{15}$ $cm^{-3}$, for example, and preferably not less than $1\times10^{14}$ $cm^{-3}$ and not more than $1\times10^{16}$ $cm^{-3}$. As the impurity concentration ($N_D$–$N_A$) in JFET region 2 and drift region 12 decreases, the electric field intensity in gate insulating film 15 decreases. Thus, the impurity concentration ($N_D$–$N_A$) in JFET region 2 and drift region 12 is preferably low.

As shown in FIG. 3, in JFET region 2, the concentration of the second impurity is higher than the concentration of the first impurity. Preferably, in the entire JFET region 2, the concentration of the second impurity is higher than the concentration of the first impurity. Preferably, in JFET region 2, a maximum value of the concentration of the second impurity is higher than a maximum value the concentration of the first impurity. As shown in FIG. 3, the concentration of the first impurity may increase from second main surface 10b toward first main surface 10a. The maximum value of the concentration of the first impurity may be located at first main surface 10a, or on the second main surface 10b side with respect to first main surface 10a. A maximum value b1 of the concentration of the first impurity is not less than $3\times10^{15}$ $cm^{-3}$ and not more than $5\times10^{15}$ $cm^{-3}$, for example.

Figure 4:
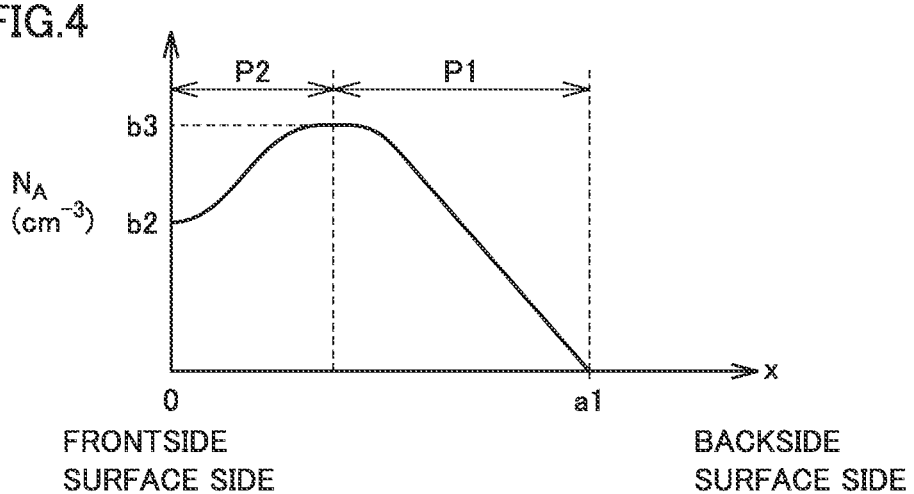
FIG. 4 is a diagram showing a relationship between the concentration of a p type impurity in a first variation of the JFET region according to the first embodiment and the position along the direction perpendicular to the first main surface.

As shown in FIG. 4, in a direction perpendicular to first main surface 10a, a position a3 at which the concentration of the first impurity exhibits the maximum value may be located between the boundary between JFET region 2 and drift region 12, and first main surface 10a. Concentration b1 of the first impurity in first main surface 10a may be lower than a concentration b3 of the first impurity at position a3. In other words, JFET region 2 may have a first portion P1 in which the concentration of the first impurity increases from second main surface 10b toward first main surface 10a, and a second portion P2 in which the concentration of the first impurity decreases from second main surface 10b toward first main surface 10a. Second portion P2 may constitute first main surface 10a. The concentration profile of the first impurity as shown in FIG. 4 is obtained by performing one-time ion implantation, for example.

Figure 5:
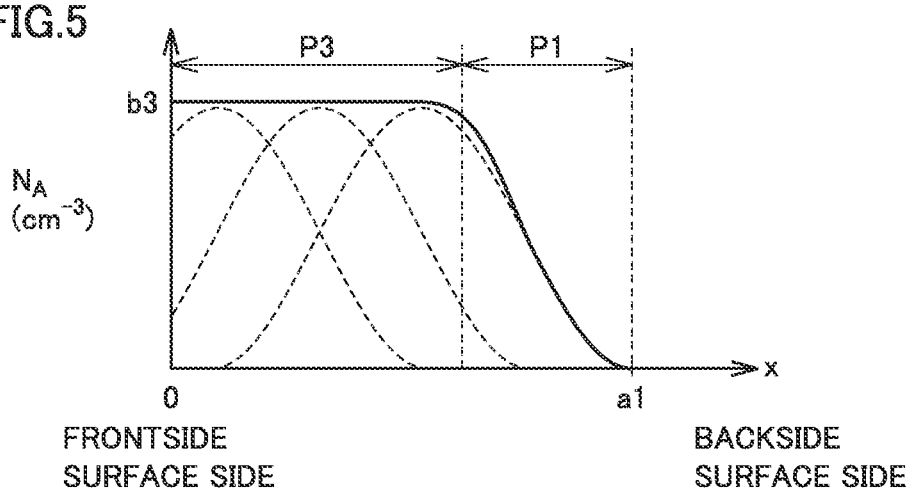
FIG. 5 is a diagram showing a relationship between the concentration of the p type impurity in a second variation of the JFET region according to the first embodiment and the position along the direction perpendicular to the first main surface.

As shown in FIG. 5, JFET region 2 may have first portion P1 in which the concentration of the first impurity increases from second main surface 10b toward first main surface 10a, and a third portion P3 in which the concentration of the first impurity is constant from second main surface 10b toward first main surface 10a. Third portion P3 may constitute first main surface 10a. The concentration profile of the first impurity as shown in FIG. 5 is obtained by performing multistage ion implantation with varying implantation energies, for example. The profiles indicated by broken lines in FIG. 5 show profiles of different implantation energies.

Source region 14 includes an n type impurity such as phosphorus and has n type conductivity. The concentration of the n type impurity included in source region 14 is about $1\times10^{20}$ $cm^{-3}$, for example. Source region 14 is separated from both JFET region 2 and drift region 12 by body region 13. The concentration of then type impurity included in source region 14 is higher than the concentration of the n type impurity included in drift region 12. As shown in FIGS. 1 and 2, source region 14 has a first source region 14a, a second source region 14b and a third source region 14c.

Contact region 18 includes a p type impurity such as aluminum and has p type conductivity. The concentration of the p type impurity included in contact region 18 is about $1\times10^{20}$ $cm^{-3}$, for example. The concentration of the p type impurity included in contact region 18 is higher than the concentration of the p type impurity included in body region 13. Contact region 18 has a first contact region 18a, a second contact region 18b and a third contact region 18c. It is noted that the elements and concentrations of the n type impurity and p type impurity, as well as the conductivity types of the respective regions described above can be measured by SIMS (Secondary Ion Mass Spectrometry), for example.

As shown in FIGS. 1 and 2, silicon carbide substrate 10 has a first cell region CL1, a second cell region CL2 and a third cell region CL3. As shown in FIG. 2, in plan view (as seen along the direction perpendicular to first main surface 10a), each of first cell region CL1, second cell region CL2 and third cell region CL3 has an outer shape of a polygon. The polygon is a hexagon, for example, and preferably a regular hexagon. In plan view, first cell region CL1 is in contact with second cell region CL2 and third cell region CL3. Second cell region CL2 is in contact with first cell region CL1 and third cell region CL3. Third cell region CL3 is in contact with first cell region CL1 and second cell region CL2.

First cell region CL1 and second cell region CL2 share one side M12a of the polygon. Second cell region CL2 and third cell region CL3 share one side M23a of the polygon. Third cell region CL3 and first cell region CL1 share one side M13a of the polygon. Side M12a, side M23a and side M13a share a triple point C0. First JFET region 2a is in contact with second JFET region 2b at side M12a. Second JFET region 2b is in contact with third JFET region 2c at side M23a. Third JFET region 2c is in contact with first JFET region 2a at side M13a.

As shown in FIG. 2, JFET region 2 includes one side M12a of the polygon. Preferably, JFET region 2 includes an end C0 of one side M12a. One side M12a is located at the boundary between first JFET region 2a and second JFET region 2b. As shown in FIG. 2, JFET region 2 may include sides M12a, M23a, M13a of the polygon, and triple point C0. Triple point C0 is located at a point on which first JFET region 2a, second JFET region 2b and third JFET region 2c are in contact with one another.

First cell region CL1 has first JFET region 2a, first drift region 12a, first body region 13a, first source region 14a and first contact region 18a. In plan view, first body region 13a, first source region 14a and first contact region 18a each have a hexagonal outer shape. First contact region 18a is surrounded by first source region 14a. First source region 14a is surrounded by first body region 13a. First body region 13a is surrounded by first JFET region 2a. First source region 14a is separated from first JFET region 2a and first drift region 12a by first body region 13a.

Second cell region CL2 has second JFET region 2b, second drift region 12b, second body region 13b, second source region 14b and second contact region 18b. In plan view, second body region 13b, second source region 14b and second contact region 18b each have a hexagonal outer shape. Second contact region 18b is surrounded by second source region 14b. Second source region 14b is surrounded by second body region 13b. Second body region 13b is surrounded by second JFET region 2b. Second source region 14b is separated from second JFET region 2b and second drift region 12b by second body region 13b.

Third cell region CL3 has third JFET region 2c, third drift region 12c, third body region 13c, third source region 14c and third contact region 18c. In plan view, third body region 13c, third source region 14c and third contact region 18c each have a hexagonal outer shape. Third contact region 18c is surrounded by third source region 14c. Third source region 14c is surrounded by third body region 13c. Third body region 13c is surrounded by third JFET region 2c. Third source region 14c is separated from third JFET region 2c and third drift region 12c by third body region 13c.

As shown in FIG. 2, in plan view, the outer shapes of first contact region 18a, second contact region 18b and third contact region 18c may be similar to the outer shapes of first source region 14a, second source region 14b and third source region 14c, respectively. Likewise, in plan view, the outer shapes of first source region 14a, second source region 14b and third source region 14c may be similar to the outer shapes of first body region 13a, second body region 13b and third body region 13c, respectively. It is noted that a portion provided between first body region 13a and second body region 13b, a portion provided between first body region 13a and third body region 13c, and a portion provided between second body region 13b and third body region 13c form JFET region 2.

As shown in FIG. 1, gate insulating film 15 is provided on first main surface 10a of silicon carbide substrate 10. Gate insulating film 15 is in contact with body region 13, source region 14 and JFET region 2 at first main surface 10a. Specifically, gate insulating film 15 is in contact with first source region 14a, first body region 13a, first JFET region 2a, second source region 14b, second body region 13b, second JFET region 2b, third source region 14c, third body region 13c and third JFET region 2c, at first main surface 10a. A channel region CH is configured such that it can be formed in a portion of body region 13 being in contact with gate insulating film 15. Gate insulating film 15 is made of a material including silicon dioxide, for example. The thickness of gate insulating film 15 is not less than 40 nm and not more than 50 nm, for example.

Gate electrode 27 is provided to face channel region CH. Gate electrode 27 is made of a material including polysilicon doped with an impurity, for example. Gate electrode 27 is provided on gate insulating film 15. Gate electrode 27 is provided to face source region 14, body region 13 and JFET region 2. Interlayer insulating film 22 is provided in contact with gate insulating film 15 and gate electrode 27. Interlayer insulating film 22 is provided to cover gate electrode 27, and electrically insulates gate electrode 27 and source electrode 16 from each other. Interlayer insulating film 22 is made of a material including silicon dioxide, for example.

Source electrode 16 has a first source electrode 16a, a second source electrode 16b and a third source electrode. First source electrode 16a is in contact with first source region 14a and first contact region 18a at first main surface 10a of silicon carbide substrate 10. Likewise, second source electrode 16b is in contact with second source region 14b and second contact region 18b at first main surface 10a. Likewise, the third source electrode is in contact with third source region 14c and third contact region 18c at first main surface 10a. Source electrode 16 is made of a material including aluminum, for example. Preferably, source electrode 16 is made of a material including TiAlSi. Source line 19 is provided in contact with source electrode 16. Source line 19 is provided to cover interlayer insulating film 22.

Drain electrode 20 is provided in contact with second main surface 10b of silicon carbide substrate 10. Drain electrode 20 is made of a material capable of making ohmic contact with n type silicon carbide single-crystal substrate 11, such as NiSi, and is electrically connected to silicon carbide single-crystal substrate 11.

The density of threading dislocations 3 in first main surface 10a is not less than 100 cm$^{-2}$ and not more than 10000 cm$^{-2}$, for example. An upper limit value of the density of threading dislocations 3 may be 5000 cm$^{-2}$, for example. A lower limit value of the density of threading dislocations 3 may be 200 cm$^{-2}$, for example. Threading dislocations 3 include threading edge dislocations and threading screw dislocations, for example. Threading dislocations 3 extend from first main surface 10a to second main surface 10b of silicon carbide substrate 10, for example. In other words, threading dislocations 3 are formed in silicon carbide epitaxial layer 24 and silicon carbide single-crystal substrate 11. Threading dislocations 3 may thread through drift region 12 and JFET region 2. From the perspective of suppressing dielectric breakdown of gate insulating film 15, the density of threading dislocations 3 in the surface of JFET region 2 in contact with gate insulating film 15 may be not less than 100 cm$^{-2}$ and not more than 10000 cm$^{-2}$.

Next, a method of measuring the density of threading dislocations will be described.

First, the silicon carbide semiconductor device covered by a resin package is immersed in fuming nitric acid to remove the resin package. Then, an Al (aluminum) line and a Cu (copper) lead frame are removed with HCl (hydrochloric acid). Interlayer insulating film 22, gate electrode 27 and gate insulating film 15 are removed with a mixed solution of HNO$_3$ (nitric acid) and HF (hydrofluoric acid). First main surface 10a of silicon carbide substrate 10 is thereby exposed. If a semiconductor chip is not covered by a resin package, the step of removing the resin package is not required.

Next, first main surface 10a of silicon carbide substrate 10 is etched with molten KOH (potassium hydroxide). The concentration of KOH is 100%, for example. The temperature of KOH is 500° C., for example. The etching period is 5 minutes, for example. Silicon carbide substrate 10 is etched by about a few hundred nm, for example. Etch pits resulting from the threading dislocations are formed in this manner.

Next, the etch pits are observed with the Olympus industrial inspection microscope (MX51). The microscope magnification is not less than 500 times and not more than 1000 times, for example. A dark field is better suited for observation than a bright field. The inspection area is desirably larger than 1 cm×1 cm, for example. In plan view, an etch pit having a hexagonal outer shape is determined to be a threading dislocation. In other words, the density of threading dislocations is determined by measuring the area density of etch pits.

Next, the operation of the MOSFET will be described. As shown in FIG. 1, when the voltage of gate electrode 27 is lower than a threshold voltage, that is, in an off state, a pn junction between body region 13 and JFET region 2 located directly below gate insulating film 15 is reverse biased and is in a non-conducting state. When a voltage equal to or higher than the threshold voltage is applied to gate electrode 27, on the other hand, an inversion layer is formed in channel region CH corresponding to gate insulating layer 15. As a result, source region 14 and JFET region 2 are electrically connected, causing a current to flow between source electrode 16 and drain electrode 20.

Next, the configuration of a variation of FIG. 2 will be described.

Figure 14:
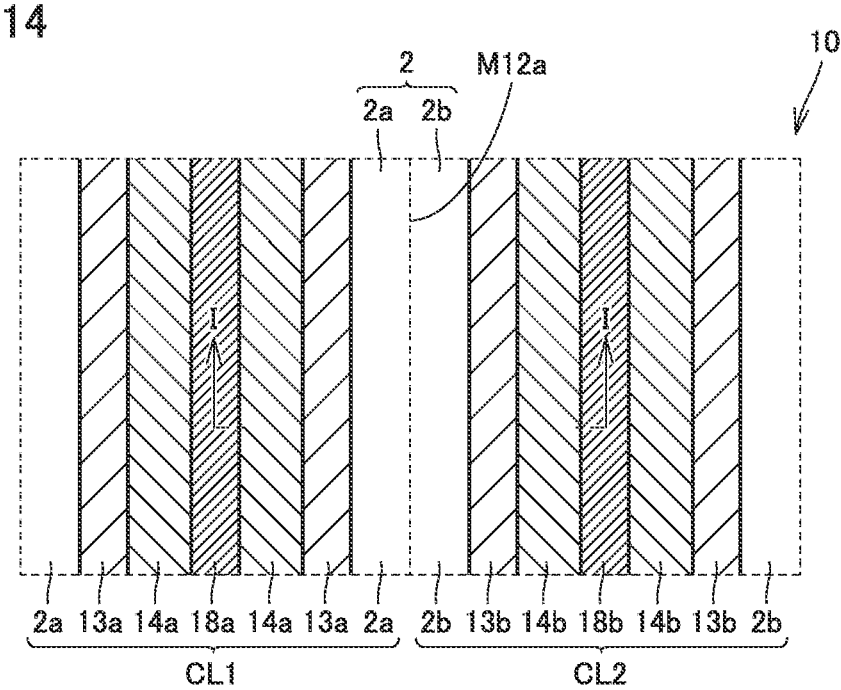
FIG. 14 is a diagram showing a variation of FIG. 2.

As shown in FIG. 14, in plan view, each of first cell region CL1 and second cell region CL2 may be a stripe-shaped cell. Put another way, each of first cell region CL1 and second cell region CL2 may have a rectangular outer shape. First cell region CL1 and second cell region CL2 share one side M12a of the rectangle. First JFET region 2a is in contact with second JFET region 2b at one side M12a.

First cell region CL1 has first JFET region 2a, first drift region 12a, first body region 13a, first source region 14a and first contact region 18a. In plan view, first body region 13a, first source region 14a and first contact region 18a each have a rectangular outer shape. First contact region 18a is provided between a pair of first source regions 14a. First source region 14a is provided between first body region 13a and first contact region 18a. First body region 13a is provided between first JFET region 2a and first source region 14a.

Second cell region CL2 has second JFET region 2b, second drift region 12b, second body region 13b, second source region 14b and second contact region 18b. In plan view, second body region 13b, second source region 14b and second contact region 18b each have a rectangular outer shape. Second contact region 18b is provided between a pair of second source regions 14b. Second source region 14b is provided between second body region 13b and second contact region 18b. Second body region 13b is provided between second JFET region 2b and second source region 14b. A portion provided between first body region 13a and second body region 13b forms JFET region 2.

Next, a method of manufacturing MOSFET 1 according to the first embodiment will be described.

Figure 6:
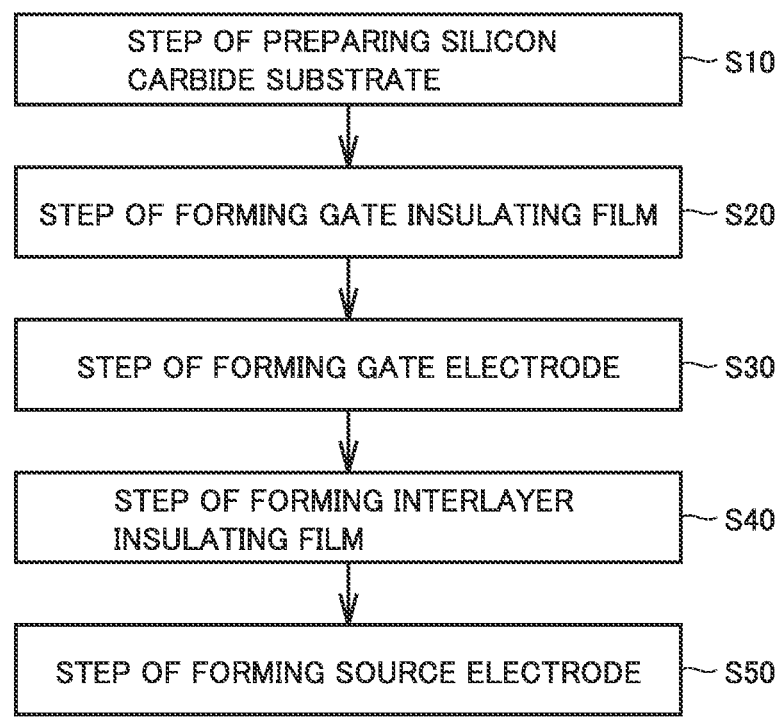
FIG. 6 is a flowchart schematically showing a method of manufacturing the silicon carbide semiconductor device according to the first embodiment.

First, a step of preparing a silicon carbide substrate (S10: FIG. 6) is performed. Specifically, silicon carbide single-crystal substrate 11 made of hexagonal silicon carbide having a polytype of 4H, for example, is prepared. Then, n type silicon carbide epitaxial layer 24 is formed on silicon carbide single-crystal substrate 11 by epitaxial growth. Silicon carbide epitaxial layer 24 includes an n type impurity such as nitrogen. The concentration of the n type impurity included in silicon carbide epitaxial layer 24 is not more than $1\times10^{16}$ cm$^{-3}$, for example. Silicon carbide epitaxial layer 24 constitutes first main surface 10a. Silicon carbide single-crystal substrate 11 constitutes second main surface 10b. First main surface 10a may be a plane angled off by not more than about 8° relative to a (0001) plane, for example.

Figure 7:
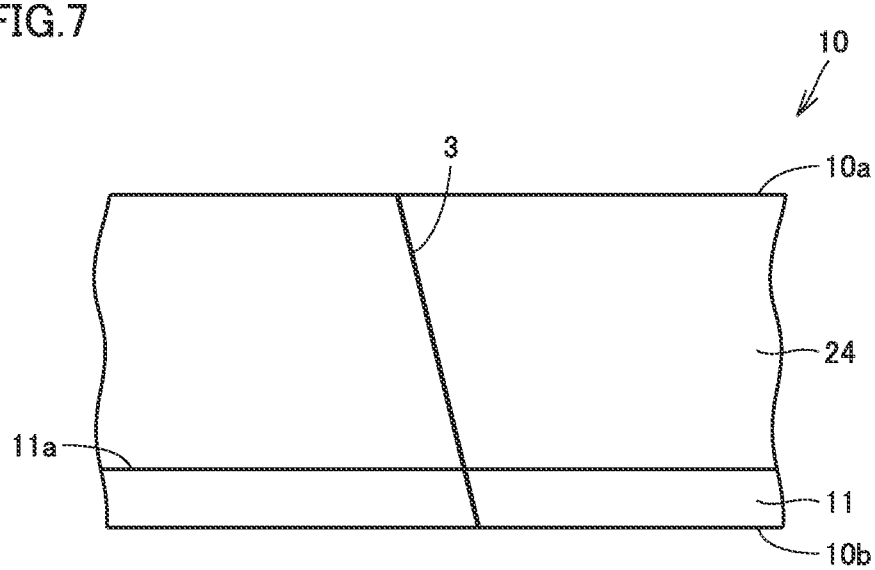
FIG. 7 is a schematic vertical sectional view schematically showing a first step of the method of manufacturing the silicon carbide semiconductor device according to the first embodiment.

As shown in FIG. 7, silicon carbide single-crystal substrate 11 includes threading dislocations 3. During the growth of silicon carbide epitaxial layer 24 on surface 11a of silicon carbide single-crystal substrate 11, threading dislocations 3 present in silicon carbide single-crystal substrate 11 are transferred to silicon carbide epitaxial layer 24. Threading dislocations 3 are exposed at first main surface 10a. The density of threading dislocations 3 exposed at first main surface 10a is not less than 100 cm$^{-2}$ and not more than 10000 cm$^{-2}$, for example. Silicon carbide substrate 10 may be prepared by selecting silicon carbide substrate 10 having the above-described threading dislocation density from among a plurality of silicon carbide substrates.

Figure 8:
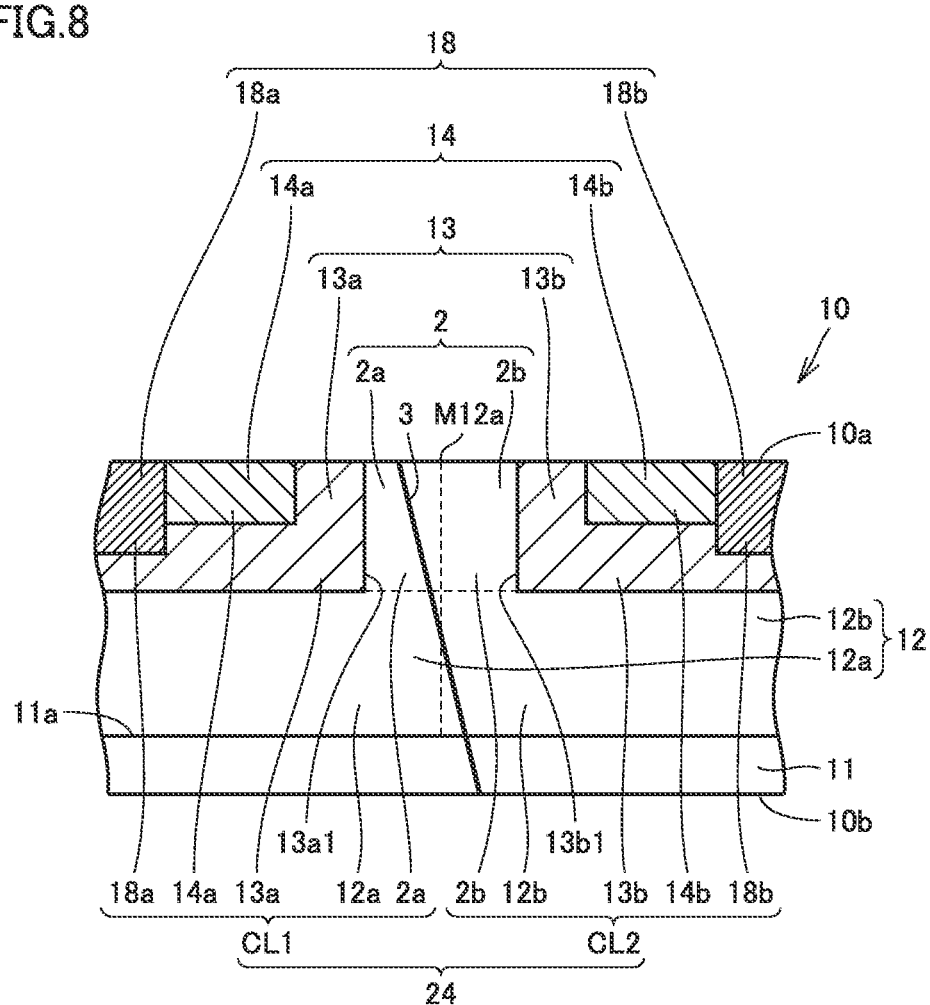
FIG. 8 is a schematic transverse sectional view schematically showing a second step of the method of manufacturing the silicon carbide semiconductor device according to the first embodiment.

Next, ion implantation is performed into first main surface 10a of silicon carbide epitaxial layer 24. Ions of a p type impurity such as aluminum are implanted into silicon carbide epitaxial layer 24. First body region 13a, second body region 13b and third body region 13c are thereby formed. Then, ions of an n type impurity such as phosphorus are implanted into each of first body region 13a, second body region 13b and third body region 13c. First source region 14a, second source region 14b and third source region 14c are thereby formed. Then, ions of a p type impurity such as aluminum are implanted into each of first source region 14a, second source region 14b and third source region 14c. First contact region 18a, second contact region 18b and third contact region 18c are thereby formed. A region provided between first body region 13a and second body region 13b serves as JFET region 2 (see FIG. 8).

Figure 9:
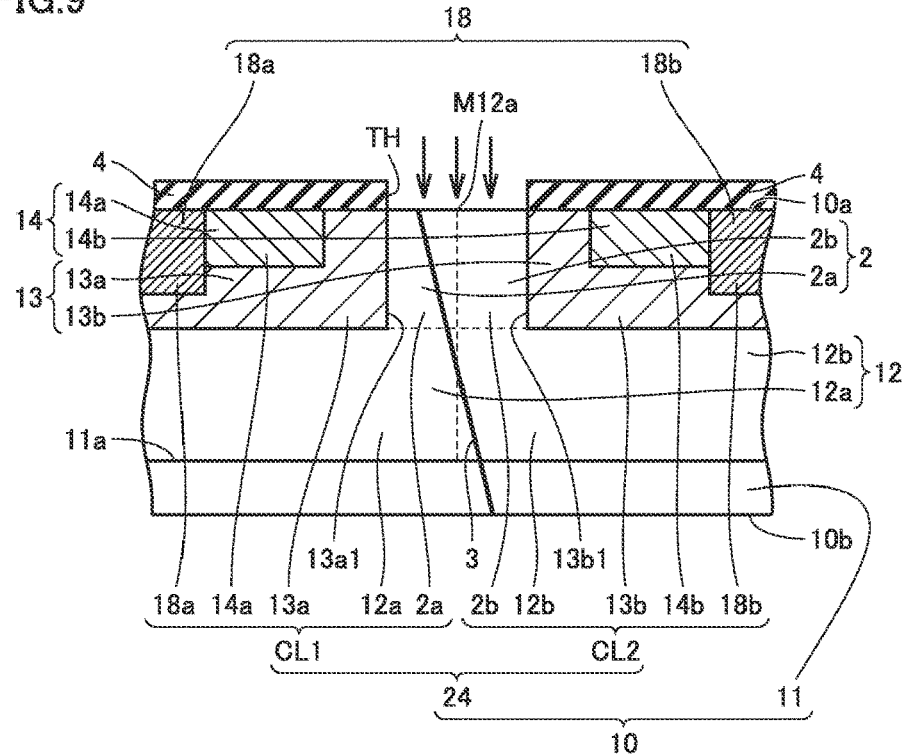
FIG. 9 is a schematic vertical sectional view schematically showing a third step of the method of manufacturing the silicon carbide semiconductor device according to the first embodiment.

Next, a mask layer 4 is formed on first main surface 10a. Mask layer 4 has an opening above JFET region 2. As shown in FIG. 9, ions of a p type impurity such as aluminum are implanted into JFET region 2 in a direction of arrows. The width of the region into which the ions are implanted is adjusted to be substantially equal to the width of JFET region 2, for example. Preferably, the p type impurity is implanted into a region at a distance of not less than 0.2 μm from body region 13 on the inner side of body region 13. Specifically, the p type impurity is implanted into a region at a distance of not less than 0.2 μm from an end 13a1 of first body region 13a toward side M12a, and at a distance of not less than 0.2 μm from an end 13b1 of second body region 13b toward side M12a. The concentration of the p type impurity which is ion implanted into JFET region 2 is lower than the concentration of the n type impurity included in JFET region 2. Mask layer 4 is then removed from first main surface 10a.

Next, an activation annealing step is performed. Specifically, heat treatment is performed in which silicon carbide substrate 10 is heated to about 1700° C., for example, and held for about 30 minutes in an atmosphere of inert gas such as argon. The ion implanted impurities are thereby activated.

Figure 10:
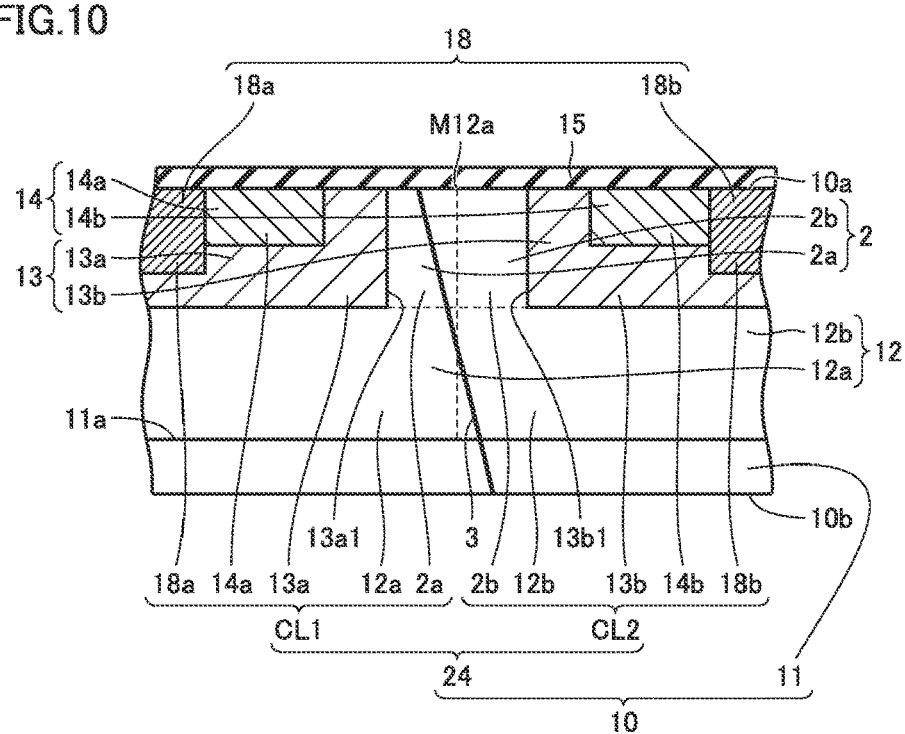
FIG. 10 is a schematic transverse sectional view schematically showing a fourth step of the method of manufacturing the silicon carbide semiconductor device according to the first embodiment.

Next, a step of forming a gate insulating film (S20: FIG. 6) is performed. Silicon carbide substrate 10 is heated at about 1300° C. for about one hour in an oxygen atmosphere, for example. Gate insulating film 15 is thereby formed on first main surface 10a of silicon carbide substrate 10. Gate insulating film 15 is formed in contact with JFET region 2, body region 13, source region 14 and contact region 18 (see FIG. 10).

Next, a nitrogen annealing step may be performed. Specifically, silicon carbide substrate 10 is held at a temperature of about 1100° C. for about one hour, for example, in a nitrogen monoxide atmosphere. Then, heat treatment may be performed in which silicon carbide substrate 10 is heated in inert gas such as argon or nitrogen. Silicon carbide substrate 10 is held at a temperature of not less than 1100° C. and not more than 1500° C. for about one hour in an argon atmosphere, for example.

Next, a step of forming a gate electrode (S30: FIG. 6) is performed. Gate electrode 27 made of polysilicon doped with an impurity is formed on gate insulating film 15 by CVD (Chemical Vapor Deposition), for example. Gate electrode 27 is formed to make contact with gate insulating film 15.

Next, a step of forming an interlayer insulating film (S40: FIG. 6) is performed. Interlayer insulating film 22 made of a material including silicon dioxide is formed by CVD, for example, to cover gate electrode 27 and to make contact with gate insulating film 15.

Figure 11:
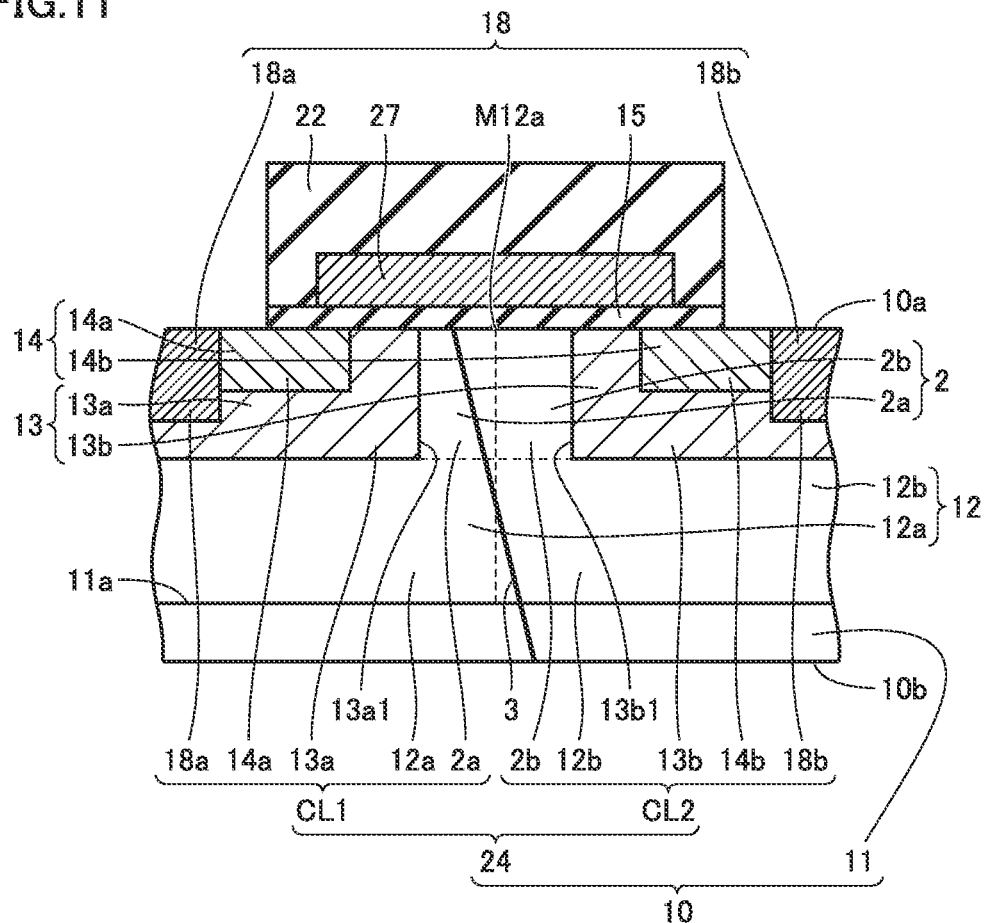
FIG. 11 is a schematic transverse sectional view schematically showing a fifth step of the method of manufacturing the silicon carbide semiconductor device according to the first embodiment.

Next, a step of forming a source electrode (S50: FIG. 6) is performed. Interlayer insulating film 22 and gate insulating film 15 in a region where source electrode 16 will be formed are removed by etching, for example. Contact region 18 and source region 14 are thereby exposed at gate insulating film 15, as shown in FIG. 11. Then, source electrode 16 is formed to make contact with contact region 18 and source region 14 by sputtering, for example. Source electrode 16 may include Ti (titanium), Al (aluminum) and Si (silicon), for example. Then, source electrode 16 and silicon carbide substrate 10 are annealed at not less than 900° C. and not more than 1100° C., for example. Source electrode 16 in ohmic contact with source region 14 is thereby formed. Preferably, source electrode 16 is in ohmic contact with contact region 18 as well.

Next, source line 19 made of a material including aluminum, for example, is formed to make contact with source electrode 16. Then, drain electrode 20 is formed in contact with second main surface 10b of silicon carbide single-crystal substrate 11. Drain electrode 20 includes NiSi, for example. MOSFET 1 shown in FIG. 1 is completed through the above-described steps.

Next, the function and effect of MOSFET 1 according to the first embodiment will be described.

In accordance with MOSFET 1 according to the first embodiment, JFET region 2 has both the first impurity capable of providing the first conductivity type and the second impurity capable of providing the second conductivity type. Accordingly, carriers of different conductivity types are offset from one another, which can lead to a reduction in effective carrier concentration in the JFET region. Thus, the dielectric breakdown of gate insulating film 15 on JFET region 2 can be suppressed.

In accordance with MOSFET 1 according to the first embodiment, the density of threading dislocations 3 in first main surface 10a is not less than 100 cm$^{-2}$ and not more than 10000 cm$^{-2}$. If there are threading dislocations 3 in first main surface 10a, an electric field tends to be concentrated particularly in portions of gate insulating film 15 formed in the vicinity of threading dislocations 3. One possible cause for the electric field concentration is that, during thermal oxidation of main surface 10a in the step of forming gate insulating film 15, pits resulting from threading dislocations 3 increase, causing the electric field to be concentrated in the vicinity of the pits. Another possible cause for the electric field concentration is that the thickness of gate insulating film 15 becomes non-uniform in the vicinity of the pits, which may have caused dielectric breakdown at the thinned portions of gate insulating film 15. By providing gate insulating film 15 on first main surface 10a in which the density of threading dislocations 3 is not less than 100 cm$^{-2}$ and not more than 10000 cm$^{-2}$, the dielectric breakdown of gate insulating film 15 formed on threading dislocations 3 can be suppressed.

Furthermore, in accordance with MOSFET 1 according to the first embodiment, the concentration of the first impurity increases from second main surface 10b toward first main surface 10a. Accordingly, the carrier concentration on the second main surface 10b side can be kept at high level while the carrier concentration on the first main surface 10a side is reduced, thereby allowing the on-resistance to be kept at low level.

Furthermore, in accordance with MOSFET 1 according to the first embodiment, the first impurity is aluminum. Since aluminum is less likely to be diffused than the other types of the first impurity, the carrier concentration in the vicinity of first main surface 10a can be accurately reduced.

Furthermore, in accordance with MOSFET 1 according to the first embodiment, the concentration of the second impurity is not less than $1 \times 10^{14}$ cm$^{-3}$ and not more than $1 \times 10^{16}$ cm$^{-3}$.

Furthermore, in accordance with MOSFET 1 according to the first embodiment, silicon carbide substrate 10 includes first cell region CL1 having an outer shape of a polygon as seen along the direction perpendicular to first main surface 10a, and second cell region CL2 sharing one side M12a of the polygon with first cell region CL1 and having an outer shape of the polygon as seen along the direction perpendicular to first main surface 10a. JFET region 2 may include end C0 of one side M12a. The dielectric breakdown of a portion of gate insulating film 15 on end C0, where the electric field tends to be concentrated, can thereby be suppressed.

Second Embodiment

Next, the configuration of MOSFET 1 as silicon carbide semiconductor device 1 according to a second embodiment of the present disclosure will be described. MOSFET 1 according to the second embodiment is mainly different from MOSFET 1 according to the first embodiment in that the concentration of the impurity included in JFET region 2 is lower than the concentration of the impurity included in drift region 12, and is otherwise substantially the same in configuration as MOSFET 1 according to the first embodiment. Thus, the same or corresponding parts are designated by the same reference numbers and description thereof will not be repeated.

As shown in FIG. 1, MOSFET 1 according to the second embodiment includes JFET region 2. JFET region 2 is provided between first body region 13a and second body region 13b in the direction parallel to first main surface 10a, and is provided between gate insulating film 15 and drift region 12 in the direction perpendicular to first main surface 10a. JFET region 2 includes an n type impurity such as nitrogen. Unlike JFET region 2 according to the first embodiment, JFET region 2 is not required to include a p type impurity such as aluminum. The concentration of the n type impurity included in JFET region 2 is lower than the concentration of the n type impurity included in drift region 12.

Figure 12:
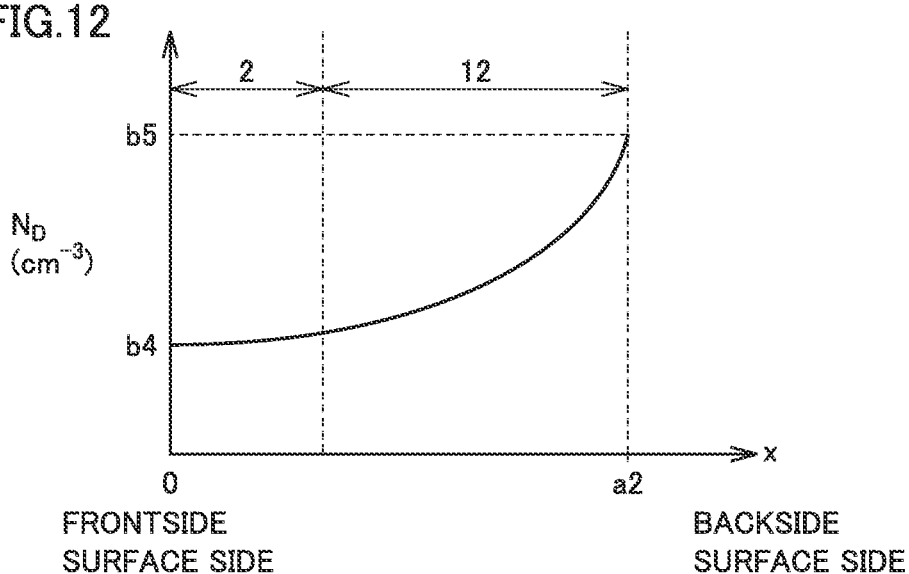
FIG. 12 is a diagram showing a relationship between the concentration of an n type impurity in the JFET region and the drift region according to a second embodiment and the position along the direction perpendicular to the first main surface.
Figure 13:
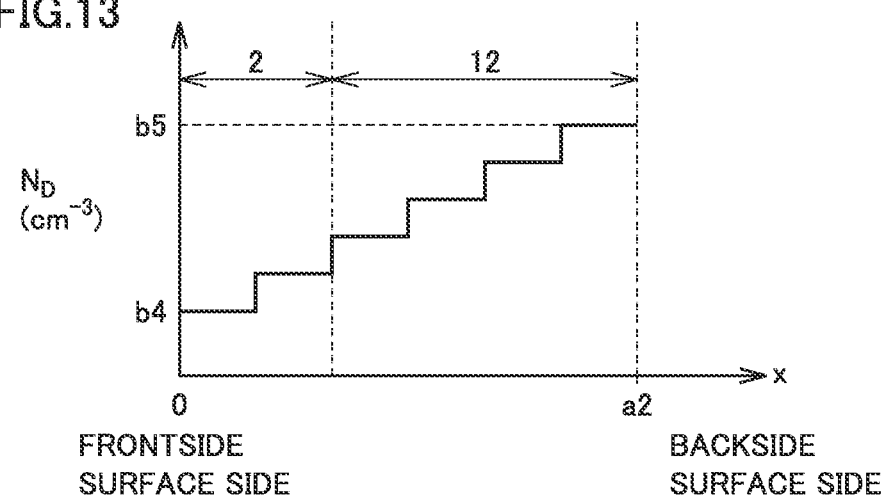
FIG. 13 is a diagram showing a relationship between the concentration of the n type impurity in a variation of the JFET region and the drift region according to the second embodiment and the position along the direction perpendicular to the first main surface.

In FIGS. 12 and 13, the vertical axis represents doping concentration of the second impurity (n type impurity) in JFET region 2 and drift region 12, and the horizontal axis represents the position along the direction of arrows in FIG. 1. In the horizontal axis, position 0 corresponds to side M12a on first main surface 10a, and position a2 corresponds to surface 11a of silicon carbide single-crystal substrate 11. In other words, position 0 is the front surface side of silicon carbide epitaxial layer 24, and position a2 is the back surface side of silicon carbide epitaxial layer 24.

As shown in FIG. 12, in JFET region 2, the concentration of the n type impurity may decrease from second main surface 10b toward first main surface 10a. Likewise, in drift region 12, the concentration of the n type impurity may decrease from second main surface 10b toward first main surface 10a. Preferably, in JFET region 2 and drift region 12, the concentration of the n type impurity decreases monotonously from second main surface 10b toward first main surface 10a. The concentration of the n type impurity included in JFET region 2 may be not less than $1 \times 10^{14}$ cm$^{-3}$ and not more than $1 \times 10^{16}$ cm$^{-3}$. In other words, in JFET region 2, a minimum value of the n type impurity may be not less than $1 \times 10^{14}$ cm$^{-3}$, and a maximum value of the n type impurity may be not more than $1 \times 10^{16}$ cm$^{-3}$. As shown in FIG. 12, the concentration of the n type impurity may exhibit a minimum value b4 at position 0 of first main surface 10a, and may exhibit a maximum value b5 at position a2 of a surface 11b. Minimum value b4 of the concentration of the n type impurity is $4.5 \times 10^{15}$ cm$^{-3}$, for example. Maximum value b5 of the concentration of then type impurity is $10 \times 10^{15}$ cm$^{-3}$, for example. The distance from position 0 to position a2 in the direction perpendicular to first main surface 10a is 15 µm, for example.

As shown in FIG. 13, in JFET region 2, the concentration of the n type impurity may decrease in stages from second main surface 10b toward first main surface 10a. Likewise, in drift region 12, the concentration of the n type impurity may decrease in stages from second main surface 10b toward first main surface 10a. Preferably, throughout JFET region 2 and drift region 12, the concentration of the n type impurity decreases monotonously from second main surface 10b toward first main surface 10a.

In the step of forming a silicon carbide epitaxial layer described in the first embodiment (see FIG. 7), the concentration profiles of the n type impurity such as shown in FIGS. 12 and 13 can be realized by varying the flow rate of nitrogen gas or gas including a nitrogen element such as ammonia, for example. In addition, the step of implanting ions of the p type impurity into JFET region 2 described in the first embodiment is omitted. The steps other than these steps are substantially the same as those of the method of manufacturing MOSFET 1 described in the first embodiment and thus will be omitted.

Although a MOSFET has been described as an example of the silicon carbide semiconductor device in the embodiments described above, the silicon carbide semiconductor device may be an IGBT (Insulated Gate Bipolar Transistor) or the like.

Next, the function and effect of MOSFET 1 according to the second embodiment will be described.

In accordance with MOSFET 1 according to the second embodiment, the concentration of the impurity included in JFET region 2 is lower than the concentration of the impurity included in drift region 12. The on-resistance can thereby be reduced while the dielectric breakdown of gate insulating film 15 on JFET region 2 is suppressed. In addition, by providing gate insulating film 15 on first main surface 10a in which the density of threading dislocations 3 is not less than 100 cm$^{-2}$ and not more than 10000 cm$^{-2}$, the dielectric breakdown of gate insulating film 15 formed on threading dislocations 3 can be suppressed.

In accordance with MOSFET 1 according to the second embodiment, the concentration of the impurity included in JFET region 2 is not less than $1 \times 10^{14}$ cm$^{-3}$ and not more than $1 \times 10^{16}$ cm$^{-3}$.

Furthermore, in accordance with MOSFET 1 according to the second embodiment, in JFET region 2, the concentration of the impurity may decrease from second main surface 10b toward first main surface 10a. The on-resistance can thereby be reduced while the dielectric breakdown of gate insulating film 15 on JFET region 2 is suppressed.

Furthermore, in accordance with MOSFET 1 according to the second embodiment, in drift region 12, the concentration of the impurity may decrease from second main surface 10b toward first main surface 10a. The on-resistance can thereby be reduced while the dielectric breakdown of gate insulating film 15 on JFET region 2 is suppressed.

It should be understood that the embodiments disclosed herein are illustrative and non-restrictive in every respect. The scope of the present invention is defined by the terms of the claims, rather than the description above, and is intended to include any modifications within the scope and meaning equivalent to the terms of the claims.

REFERENCE SIGNS LIST

1 MOSFET (silicon carbide semiconductor device); 2 JFET region; 2a first JFET region; 2b second JFET region; 2c third JFET region; 3 threading dislocation; 4 mask layer; 10 silicon carbide substrate; 10a first main surface (main surface); 10b second main surface; 11 silicon carbide single-crystal substrate; 11a, 11b surface; 12 drift region; 12a first drift region; 12b second drift region; 12c third drift region; 13 body region; 13a first body region; 13b second body region; 13c third body region; 14 source region; 14a first source region; 14b second source region; 14c third source region; 15 gate insulating film; 16 source electrode; 16a first source electrode; 16b second source electrode; 18 contact region; 18a first contact region; 18b second contact region; 18c third contact region; 19 source line; 20 drain electrode; 22 interlayer insulating film; 24 silicon carbide epitaxial layer; 27 gate electrode; C0 end (triple point); CH channel region; CL1 first cell region; CL2 second cell region; CL3 third cell region; M12a, M13a, M23a one side, side; P1 first portion; P2 second portion; P3 third portion.

The invention claimed is:
1. A silicon carbide semiconductor device comprising:
a silicon carbide substrate having a first main surface and
  a second main surface opposite to the first main surface; and
a gate insulating film provided on the first main surface,
the silicon carbide substrate including
  a first body region being in contact with the gate insulating film at the first main surface and having a first conductivity type,
  a second body region being in contact with the gate insulating film at the first main surface and having the first conductivity type,
  a drift region having a second conductivity type different from the first conductivity type, and
  a JFET region provided between the first body region and the second body region in a direction parallel to the first main surface, provided between the gate insulating film and the drift region in a direction perpendicular to the first main surface, and having the second conductivity type, the JFET region and the drift region each having an impurity capable of providing the second conductivity type, a density of threading dislocations in the first main surface being not less than 100 cm$^{-2}$ and not more than 10000 cm$^{-2}$, a concentration of the impurity included in the JFET region being lower than a concentration of the impurity included in the drift region, the first conductivity type being p type and the second conductivity type being n type.

2. The silicon carbide semiconductor device according to claim 1, wherein the concentration of the impurity included in the JFET region is not less than $1\times10^{14}$ cm$^{-3}$ and not more than $1\times10^{16}$ cm$^{-3}$.

3. The silicon carbide semiconductor device according to claim 1, wherein in the JFET region, the concentration of the impurity decreases from the second main surface toward the first main surface.

4. The silicon carbide semiconductor device according to claim 1, wherein in the drift region, the concentration of the impurity decreases from the second main surface toward the first main surface.

* * * * *